United States Patent
Kim et al.

(10) Patent No.: US 12,183,390 B2
(45) Date of Patent: Dec. 31, 2024

(54) MEMORY DEVICE DATA LOSS PREVENTION

(71) Applicant: SAMSUNG ELECTRONICS CO., LTD., Suwon-si (KR)

(72) Inventors: Hijung Kim, Suwon-si (KR); Jung Min You, Hwaseong-si (KR); Seong-Jin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 177 days.

(21) Appl. No.: 17/953,524

(22) Filed: Sep. 27, 2022

(65) Prior Publication Data
US 2023/0223073 A1    Jul. 13, 2023

(30) Foreign Application Priority Data

Jan. 7, 2022  (KR) .................. 10-2022-0003017
Apr. 18, 2022 (KR) .................. 10-2022-0047536

(51) Int. Cl.
| | |
|---|---|
| G11C 8/00 | (2006.01) |
| G11C 11/408 | (2006.01) |
| G11C 11/4096 | (2006.01) |
| G11C 17/16 | (2006.01) |

(52) U.S. Cl.
CPC ........ *G11C 11/4096* (2013.01); *G11C 11/408* (2013.01); *G11C 17/165* (2013.01)

(58) Field of Classification Search
CPC .................................................. G11C 11/408
USPC ...................................................... 365/230.01
See application file for complete search history.

(56) References Cited

U.S. PATENT DOCUMENTS

| | | | |
|---|---|---|---|
| 9,032,141 | B2 | 5/2015 | Bains et al. |
| 9,286,964 | B2 | 3/2016 | Halbert et al. |
| 9,805,783 | B2 | 10/2017 | Ito et al. |
| 9,953,696 | B2 | 4/2018 | Kim |
| 9,972,377 | B2 | 5/2018 | Oh et al. |
| 10,262,717 | B2 | 4/2019 | Fisch et al. |
| 10,490,252 | B2 | 11/2019 | Ito et al. |
| 10,607,679 | B2 | 3/2020 | Nakaoka |
| 10,770,127 | B2 | 9/2020 | Shore et al. |
| 10,950,289 | B2 | 3/2021 | Ito et al. |
| 11,361,831 | B2 | 6/2022 | Sharifi Tehrani et al. |

(Continued)

FOREIGN PATENT DOCUMENTS

| | | |
|---|---|---|
| CN | 108369820 A | 8/2018 |
| CN | 113330518 A | 8/2021 |

(Continued)

*Primary Examiner* — Hoai V Ho
(74) *Attorney, Agent, or Firm* — Muir Patent Law, PLLC

(57) ABSTRACT

Disclosed is a memory device which includes a memory core that includes a plurality of memory cells, and control logic that receives a first active command and a first row address from an external device and activates memory cells corresponding to the first row address from among the plurality of memory cells in response to the first active command. The control logic includes registers and counters. The control logic records the first row address in one of the registers, counts an activation count of the first row address by using a first counter of the counters, and counts a lifetime count of the first row address by using a second counter of the counters.

20 Claims, 15 Drawing Sheets

(56) References Cited

U.S. PATENT DOCUMENTS

| | | | |
|---|---|---|---|
| 2005/0122801 A1* | 6/2005 | Hsu | G11C 29/808 |
| | | | 365/200 |
| 2017/0011792 A1 | 1/2017 | Oh et al. | |
| 2019/0348107 A1* | 11/2019 | Shin | G11C 11/40618 |
| 2020/0042423 A1 | 2/2020 | Mazumder et al. | |
| 2020/0411095 A1 | 12/2020 | Kim et al. | |
| 2021/0183433 A1 | 6/2021 | Jenkinson et al. | |
| 2022/0147250 A1* | 5/2022 | Lee | G06F 3/0632 |

FOREIGN PATENT DOCUMENTS

| | | |
|---|---|---|
| CN | 113539342 A | 10/2021 |
| KR | 10-2017-0024307 A | 3/2017 |
| TW | I1655627 B | 4/2019 |

* cited by examiner

| Register ID | Row Address | Activation Count |
|---|---|---|
| REG1 | RA1 | 5 |
| REG2 | RA2 | 4 |
| REG3 | RA3 | 6 |
| REG4 | | |

| Register ID | Row Address | Activation Count |
|---|---|---|
| REG1 | RA1 | 5 |
| REG2 | RA2 | 4 |
| REG3 | RA3 | 6 |
| REG4 | RA4 | 1 |

| Register ID | Row Address | Activation Count |
|---|---|---|
| REG1 | RA1 | 5 |
| REG2 | RA2 | 4 |
| REG3 | RA3 | 6 |
| REG4 | RA5 | 1 |

FIG. 10

| Register ID | Row Address | Activation Count | Lifetime |
|---|---|---|---|
| REG1 | RA1 | 5 | 1 |
| REG2 | RA2 | 4 | 2 |
| REG3 | RA3 | 6 | 0 |
| REG4 | | | |

| Register ID | Row Address | Activation Count | Lifetime |
|---|---|---|---|
| REG1 | RA1 | 5 | 0 |
| REG2 | RA2 | 4 | 1 |
| REG3 | RA3 | 6 | 0 |
| REG4 | RA4 | 1 | 3 |

| Register ID | Row Address | Activation Count | Lifetime |
|---|---|---|---|
| REG1 | RA1 | 5 | 0 |
| REG2 | RA5 | 1 | 3 |
| REG3 | RA3 | 6 | 0 |
| REG4 | RA4 | 3 | 4 |

MEMORY DEVICE DATA LOSS PREVENTION

CROSS-REFERENCE TO RELATED APPLICATIONS

This application claims priority under 35 U.S.C. § 119 to Korean Patent Application Nos. 10-2022-0003017 filed on Jan. 7, 2022, and 10-2022-0047536 filed on Apr. 18, 2022, in the Korean Intellectual Property Office, the disclosures of which are incorporated by reference herein in their entireties.

BACKGROUND

1. Field

Embodiments relate to a memory device and an operating method of a memory device.

2. Description of the Related Art

A memory device may include memory cells arranged in rows and columns. The memory device may select one of rows of memory cells, and may access memory cells of the selected row. When one row is selected and activated, a voltage of the selected row (e.g., a word line voltage of the selected row) may be different from voltages of unselected rows (e.g., word line voltages of the unselected rows). Memory cells of rows adjacent to the selected row may experience stress due to the voltage difference between the selected row and the unselected row.

When a specific row of the rows of the memory device is intensively activated, data stored in memory cells of rows adjacent to the specific row may be lost. This phenomenon is called row hammering. Because the row hammering can cause a data error, it is desirable to prevent the row hammering in advance.

SUMMARY

According to an embodiment, a memory device includes a memory core that includes a plurality of memory cells, and control logic that receives a first active command and a first row address from an external device and activates memory cells corresponding to the first row address from among the plurality of memory cells in response to the first active command. The control logic includes registers and counters. The control logic records the first row address in one of the registers, counts an activation count of the first row address by using a first counter of the counters, and counts a lifetime count of the first row address by using a second counter of the counters.

According to an embodiment, a memory device includes a memory core that includes a plurality of memory cells, and control logic that receives a first active command and a first row address from an external device and activates memory cells corresponding to the first row address from among the plurality of memory cells in response to the first active command. The control logic includes registers and counters. In first mode, the control logic records the first row address in one of the registers, counts an activation count of the first row address by using a first counter of the counters, and counts a lifetime count of the first row address by using a second counter of the counters. In second mode, the control logic records the first row address in one of the registers, and counts the activation count of the first row address by using the first counter of the counters According to an embodiment, an operating method of a memory device which includes memory cells and registers configured to record row addresses includes receiving, at the memory device, an active command and a row address from an external device, evicting a row address, which has a lifetime count of "0" and has a smallest activation count, from among row addresses recorded in the registers when row addresses are recorded in all the registers, and storing, at the memory device, the row address in an empty register of the registers, increasing an activation count of the row address, and increasing a lifetime count of the row address.

BRIEF DESCRIPTION OF THE DRAWINGS

Features will become apparent to those of skill in the art by describing in detail example embodiments with reference to the attached drawings in which:

FIGS. 4 to 8 illustrate a reference example of a method of operating a row hammering control logic of a memory device, in which FIG. 5 illustrates row addresses and activation counts recorded in row hammering registers of the reference example of FIG. 4; FIG. 6 illustrates an access to a memory device made in a state where row RA and activation counts are recorded in first to fourth registers, like FIG. 5; and FIGS. 7 and 8 illustrate information recorded in first to fourth registers is updated when accesses are made as illustrated in FIG. 6.

FIG. 10 illustrates an example of row addresses, activation counts, and lifetime counts recorded in row hammering registers, according to the example embodiment of FIG. 9.

FIGS. 11 and 12 illustrate examples in which information recorded in first to fourth registers of FIG. 10 is updated when accesses are made as illustrated in FIG. 6.

FIG. 13 illustrates a first example of a method in which a memory device adjusts a default lifetime count, an increment count, or an upper limit of a lifetime count.

DETAILED DESCRIPTION

Figure 1:
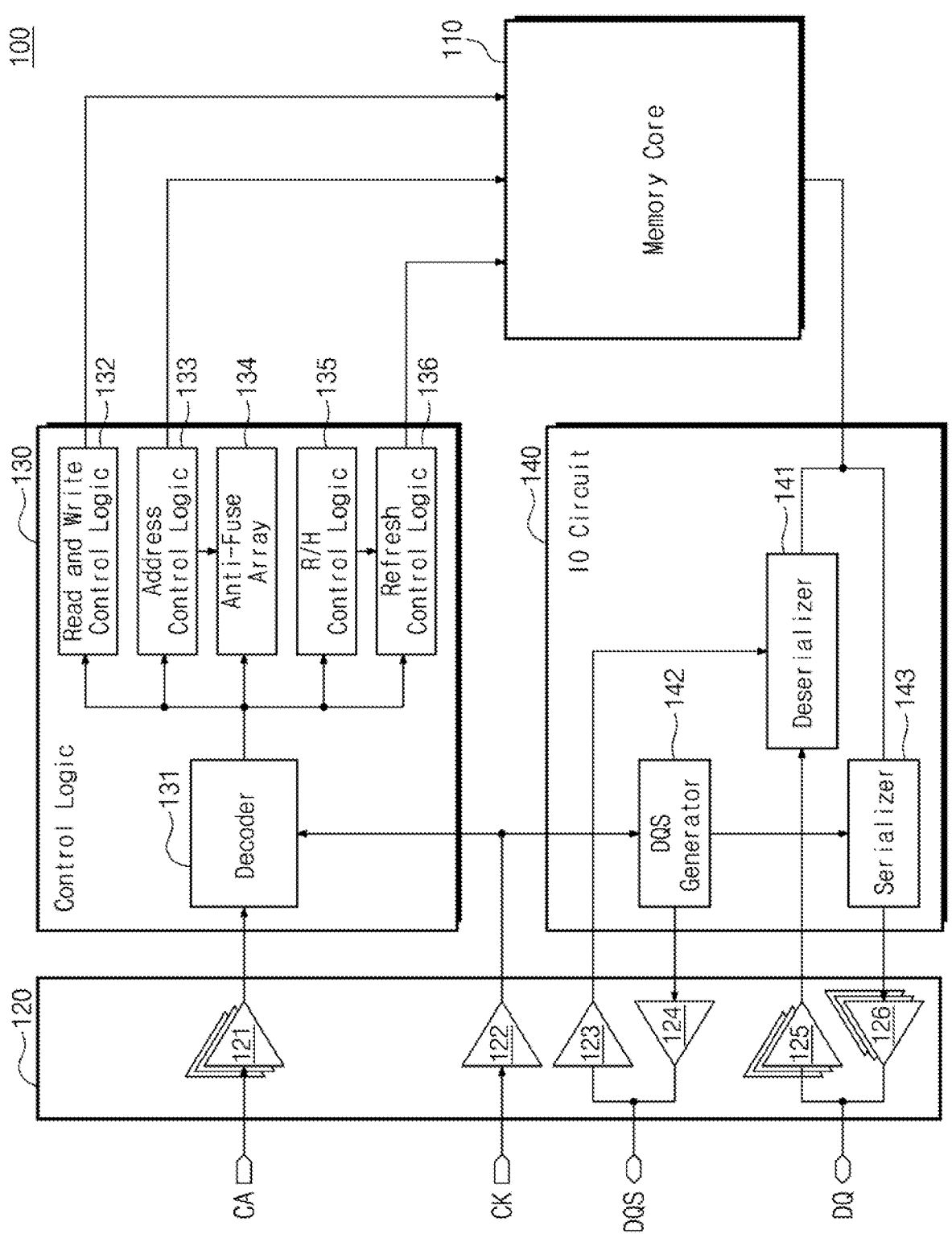
FIG. 1 illustrates a memory device according to an example embodiment.

FIG. 1 illustrates a memory device 100 according to an example embodiment.

Referring to FIG. 1, the memory device 100 may include a memory core 110, a buffer circuit 120, control logic 130, and an input and output circuit 140.

The memory core 110 may refer to a core of the memory device 100. The memory core 110 may include memory cells, circuits for writing data in the memory cells, and circuits for reading data from the memory cells.

The buffer circuit 120 may exchange signals with an external device. The buffer circuit 120 may include first buffers 121, a second buffer 122, a third buffer 123, a fourth buffer 124, fifth buffers 125, and sixth buffers 126.

The first buffers 121 may receive a command/address CA from the external device.

The first buffers 121 may transfer the command/address CA to the control logic 130. For example, the command/address CA may include an active command, a bank group address, a bank address, and a row address. The command/address CA may include a read command and a column address or may include a write command and a column address.

The second buffer 122 may receive a clock signal CK from the external device. The second buffer 122 may provide the clock signal CK to the control logic 130 and the input and output circuit 140. In an implementation, the second buffer 122 may include two or more buffers receiving two or more clock signals.

The third buffer 123 may receive a data strobe signal DQS from the external device. The third buffer 123 may provide the data strobe signal DQS to the input and output circuit 140. In an implementation, the third buffer 123 may include two or more buffers receiving two or more data strobe signals.

The fourth buffer 124 may output the data strobe signal DQS to the external device.

The fourth buffer 124 may output the data strobe signal DQS transferred from the input and output circuit 140 to the external device. In an implementation, the fourth buffer 124 may include two or more buffers outputting two or more data strobe signals.

The third buffer 123 and the fourth buffer 124 may be connected with the external device through a common signal line. Thus, the third buffer 123 may receive the data strobe signal DQS from the external device through the common signal line, and the fourth buffer 124 may output the data strobe signal DQS to the external device through the common signal line.

The fifth buffers 125 may receive data signals DQ from the external device. The fifth buffers 125 may provide the data signals DQ to the input and output circuit 140.

The sixth buffers 126 may output the data signals DQ to the external device. The sixth buffers 126 may output the data signals DQ transferred from the input and output circuit 140 to the external device.

The fifth buffers 125 and the sixth buffers 126 may be connected with the external device through common signal lines. Thus, the fifth buffers 125 may receive the data signals DQ from the external device through the common signal lines, and the sixth buffers 126 may output the data signals DQ to the external device through the common signal lines.

The control logic 130 may receive the command/address CA from the first buffers 121 of the buffer circuit 120, and may receive the clock signal CK from the second buffer 122 of the buffer circuit 120. The control logic 130 may include a decoder 131, read and write control logic 132, address control logic 133, an anti-fuse array 134, row hammering control logic 135, and refresh control logic 136.

The decoder 131 may store the command/address CA in synchronization with the clock signal CK transferred through the second buffer 122 of the buffer circuit 120. The decoder 131 may parse the command/address CA, and may control the read and write control logic 132, the address control logic 133, the anti-fuse array 134, the row hammering control logic 135, and the refresh control logic 136 based on a parsed result.

Under control of the decoder 131, the read and write control logic 132 may control the memory core 110 such that a read or write operation is performed on the memory core 110. Under control of the decoder 131, the address control logic 133 may control the memory core 110 such that there is activated one row of memory cells of the memory core 110, which corresponds to a bank group address, a bank address, and a row address of the command/address CA. The address control logic 133 may control the memory core 110 such that columns corresponding to a column address of the command/address CA from among columns associated with the activated row are electrically connected with the input and output circuit 140.

The address control logic 133 may refer to the anti-fuse array 134. The anti-fuse array 134 may store addresses (e.g., including a bank group address and a bank address) of defective rows among rows of memory cells of the memory core 110. When a row address (e.g., including a bank group address and a bank address) of the command/address CA is present in the anti-fuse array 134, the address control logic 133 may allow the memory core 110 to activate a spare row that is set to replace a row corresponding to the command/address CA. An address (e.g., including a bank group address and a bank address) of the spare row may be stored in the anti-fuse array 134. Row addresses (e.g., including bank group addresses and bank addresses) of the anti-fuse array 134 may be written by the decoder 131.

The row hammering control logic 135 may prevent data from being lost by the row hammering. For example, when it is detected that the row hammering occurs at a specific row, the row hammering control logic 135 may allow the refresh control logic 136 to perform the refresh operation on neighboring rows.

For example, the refresh control logic 136 may control the refresh operation of memory cells of the memory core 110. The refresh operation may include recovering a retention characteristic of data by reading data from memory cells and again writing the read data therein. The refresh control logic 136 may allow the memory core 110 to perform the refresh operation, 1) based on a timer that is internally controlled, 2) under control of the decoder 131 that operates based on the command/address CA transferred from the external device, or 3) under control of the row hammering control logic 135.

The input and output circuit 140 may convert the data signals DQ transferred from the buffer circuit 120 so as to be transferred to the memory core 110, and may convert data transferred from the memory core 110 into the data signals DQ and may provide the data signals DQ to the buffer circuit 120. The input and output circuit 140 may include a deserializer 141, a data strobe signal generator 142, and a serializer 143.

The deserializer 141 may receive the data strobe signal DQS through the third buffer 123 of the buffer circuit 120. The deserializer 141 may deserialize (e.g., parallelize) the data signals DQ transferred through the fifth buffers 125 in synchronization with the data strobe signal DQS. The deserializer 141 may output the deserialized data signals to the memory core 110.

The data strobe signal generator 142 may receive the clock signal CK from the second buffer 122 of the buffer circuit 120. The data strobe signal generator 142 may divide the clock signal CK to generate the data strobe signal DQS. The data strobe signal generator 142 may output the data strobe signal DQS to the fourth buffer 124 of the buffer circuit 120 and the serializer 143.

The serializer 143 may receive the data strobe signal DQS from the data strobe signal generator 142. The serializer 143 may serialize data transferred from the memory core 110 in synchronization with the data strobe signal DQS. The serializer 143 may output the serialized data as the data signals DQ to the sixth buffers 126 of the buffer circuit 120.

Figure 2:
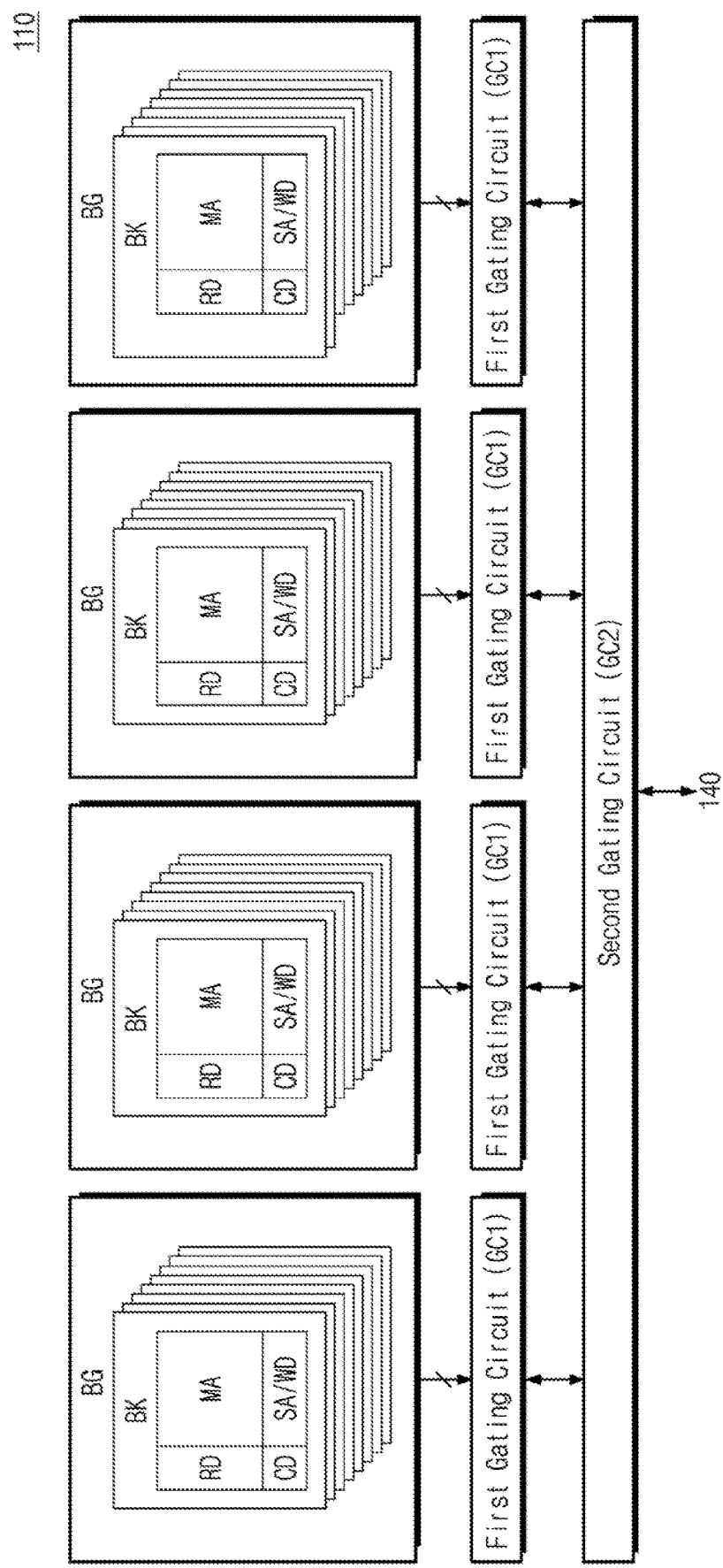
FIG. 2 illustrates an example of a memory core.

FIG. 2 illustrates an example of the memory core 110.

Referring to FIGS. 1 and 2, the memory core 110 may include bank groups BG, first gating circuits GC1, and a second gating circuit GC2.

Each of the bank groups BG may include a plurality of banks BK. For example, each of the bank groups BG may include 4 or 8 banks BK, but the number of banks BK included in each of the bank groups BG may be varied.

Each of the banks BK may include a memory cell array MA, a row decoder RD, a sense amplifier and write driver SA/WD, and a column decoder CD. The memory cell array MA may include memory cells arranged in rows and columns.

The row decoder RD may be connected with the rows of memory cells of the memory cell array MA through word lines. In response to that an active command ACT and an address (e.g., a bank group address, a bank address, and a row address) as the command/address CA are received, the row decoder RD may activate a row (e.g., a word line) corresponding to the row address of the command/address CA from among the rows (e.g., word lines) of memory cells.

In response to the active command ACT and an address (e.g., a bank group address, a bank address, and a row address) of the command/address CA being received, the sense amplifier and write driver SA/WD may read and store data from memory cells of a row corresponding to the row address. When the activated row is deactivated (e.g., when any other row is activated), the sense amplifier and write driver SA/WD may write the stored data at the activated row.

In response to a write command and a column address as the command/address CA being received, or in response to a read command and a column address as the command/address CA being received, the column decoder CD may electrically connect storage data corresponding to the column address, from among the data stored in the sense amplifier and write driver SA/WD, with input and output lines of a bank.

The first gating circuits GC1 may be respectively connected with the bank groups BG. In response to that the active command ACT and an address (e.g., a bank group address, a bank address, and a row address) as the command/address CA are received, the first gating circuit GC1 may electrically connect input and output lines of a bank, which the bank address indicates, with input and output lines of the first gating circuit GC1.

The second gating circuit GC2 may be connected with the first gating circuits GC1. In response to that the active command ACT and an address (e.g., a bank group address, a bank address, and a row address) as the command/address CA are received, the second gating circuit GC2 may electrically connect the input and output lines of the first gating circuit GC1 corresponding to the bank group address with input and output lines of the input and output circuit 140.

In an example embodiment, the row decoder RD, the column decoder CD, the first gating circuits GC1, and the second gating circuit GC2 may operate under control of the address control logic 133.

Figure 3:
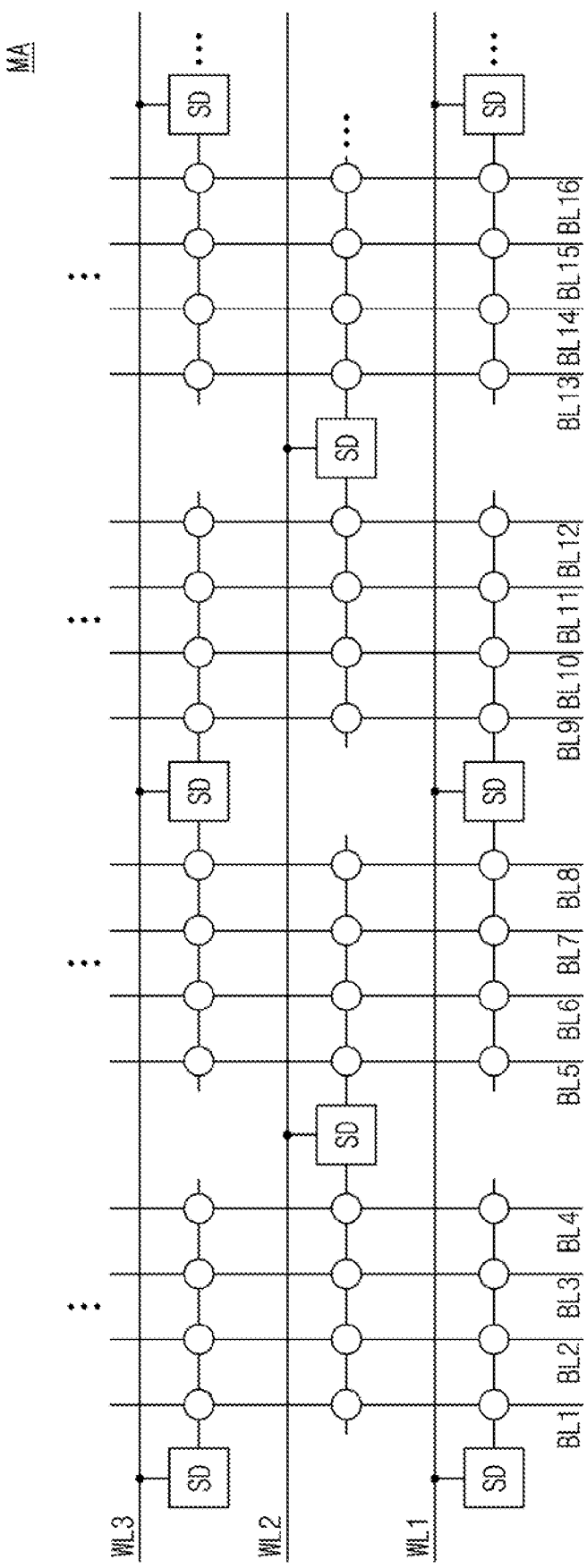
FIG. 3 illustrates an example of a memory cell array.

FIG. 3 illustrates an example of the memory cell array MA.

Referring to FIGS. 1, 2, and 3, a first word line WL1, a second word line WL2, and a third word line WL3 may be connected with sub-decoders SD. Sub-word lines may be connected with one end or opposite ends of each of the sub-decoders SD. Each of the sub-word lines may be connected with memory cells (marked by a circle). An example in which one sub-word line is connected with 4 memory cells is illustrated, but the number of memory cells connected with one sub-word line may be varied.

Columns of memory cells may be connected with bit lines. An example in which memory cells are connected with first to sixteenth bit lines BL1 to BL16 is illustrated in FIG. 3, but the number of bit lines may be varied.

An example in which one row decoder RD is connected with the memory cell array MA is illustrated in FIG. 2, but the number of row decoders RD may be varied. For example, row decoders may be respectively connected with opposite ends of the memory cell array MA. Also, a complementary memory cell array may be provided at a lower end of the sense amplifier and write driver SA/WD. The complementary memory cell array may store complementary data in association with the memory cell array MA. The sense amplifier and write driver SA/WD may complementarily store data in the memory cell array MA and the complementary memory cell array, and may complementarily read data from the memory cell array MA and the complementary memory cell array.

In an example embodiment, memory cells may be implemented with capacitors storing charges. When the second word line WL2 is repeatedly activated (e.g., when the row hammering occurs at the second word line WL2), charges stored in memory cells connected with the first word line WL1 and memory cells connected with the third word line WL3 may be leaked out or introduced by the coupling. Thus, the bit flip may occur at the memory cells connected with the first and third word lines WL1 and WL3 adjacent to the second word line WL2 that is repeatedly activated. The bit flip due to the row hammering may cause the loss of data.

FIGS. 4 to 8 illustrate a reference example of a method of operating a row hammering control logic of a memory device.

As described in detail below, in the reference example, an activation count of a fourth row address RA4 may not be managed.

Figure 4:
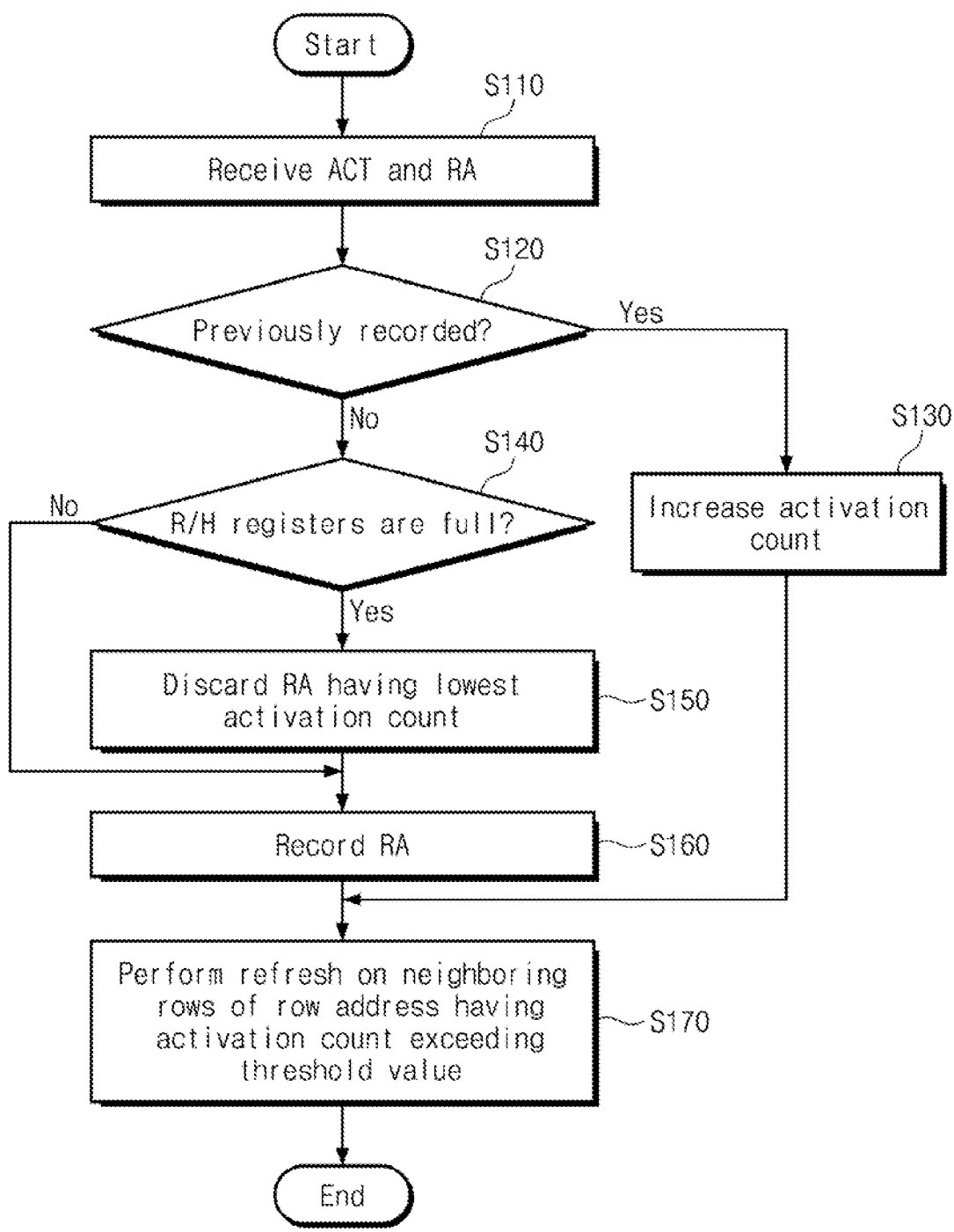
Figures 5, 6:
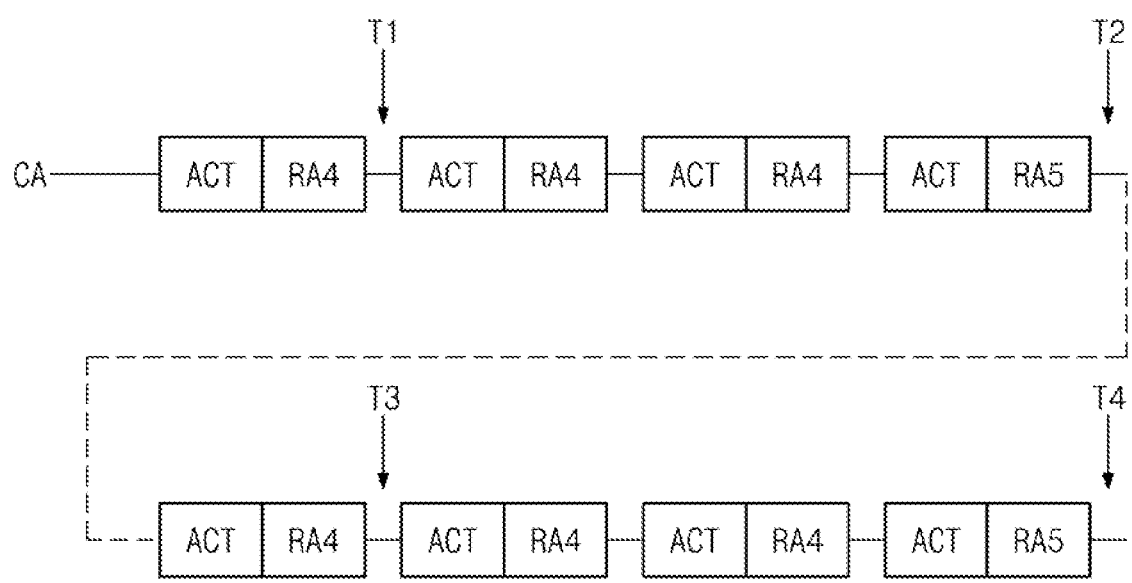

First, FIG. 4 illustrates a reference row hammering compensation operation of the row hammering control logic 135, while FIG. 5 illustrates row addresses and activation counts recorded in row hammering registers of the reference example of FIG. 4.

Referring to FIGS. 1, 2, 4, and 5, in operation S110 of the reference example, the memory device 100 may receive the active command ACT and a row address RA. Below, the row address RA may be regarded as including a bank group address and a bank address.

In operation S120, the control logic 130 may determine whether the received row address RA is previously recorded in row hammering registers of the row hammering control logic 135. When it is determined that the received row address RA is previously recorded in the row hammering registers, the row hammering control logic 135 may increase an activation count associated with the received row address RA. Afterwards, the memory device 100 may perform operation S170.

When it is determined in operation S120 that the received row address RA is not previously recorded in the row hammering registers, the memory device 100 may perform operation S140. In operation S140, the control logic 130 may determine whether the row hammering registers are full. For example, the control logic 130 may determine whether row addresses are recorded in all the row hammering registers.

When it is determined that the row hammering registers are not full, the memory device 100 may perform operation S160. When it is determined that the row hammering registers are full, in operation S150, the control logic 130 may evict a row address having the lowest activation count from among row addresses recorded in the row hammering registers. As the row address is evicted, the control logic 130 may secure a row hammering register in which the received row address RA is to be recorded.

In operation S160, the row hammering control logic 135 of the control logic 130 may record the received row address RA in a row hammering register that is empty from among the row hammering registers.

In operation S170, the row hammering control logic 135 may perform the refresh operation based on a row address that has an activation count exceeding a threshold value from among activation counts of row addresses recorded in the row hammering registers. For example, the row hammering control logic 135 may control the refresh control logic 136 such that the refresh operation is performed on rows adjacent to a row corresponding to a row address whose activation count exceeds the threshold value.

As another example, when the refresh control logic 136 performs the refresh operation based on a refresh policy, the row hammering control logic 135 may allow the refresh control logic 136 to perform the refresh operation even with respect to a row address, which has an activation count exceeding the threshold value, from among row addresses recorded in the row hammering registers.

As another example, when the refresh control logic 136 performs the refresh operation based on a refresh policy, the row hammering control logic 135 may allow the refresh control logic 136 to perform the refresh operation together with respect to "N" row addresses, which have the highest activation count (e.g., regardless of the threshold value), from among row addresses recorded in the row hammering registers. Herein, "N" may be a positive integer and may be set or adjusted depending on a policy of the row hammering control logic 135 or by the external device.

After the refresh operation is performed, the row hammering control logic 135 may reset the activation count of the row address having the activation count exceeding the threshold value or may remove the row address having the activation count exceeding the threshold value from the row hammering registers.

As described above, according to the reference example, the memory device 100 may use activation counts of row addresses in an effort to prevent data from being lost due to the row hammering.

Referring to FIGS. 1 and 5, row hammering registers may include first to fourth registers REG1 to REG4.

In FIG. 5, in the reference example, the row hammering control logic 135 has recorded a first row address RA1 in the first register REG1, and counted an activation count of "5" in association with the first row address RA1 (e.g., using a counter). Also, the row hammering control logic 135 has recorded a second row address RA2 in the second register REG2, and counted an activation count of "4" in association with the second row address RA2 (e.g., using a counter). Also, the row hammering control logic 135 has recorded a third row address RA3 in the third register REG3, and counted an activation count of "6" in association with the third row address RA3 (e.g., using a counter).

FIG. 6 illustrates an access to the memory device 100 made in a state where the row addresses RA and activation counts are recorded in the first to fourth registers REG1 to REG4, like FIG. 5.

The active commands ACT and the row addresses RA are illustrated in FIG. 6, and a write command, a read command, or a column address is omitted from FIG. 6.

FIGS. 7 and 8 illustrate examples in which information recorded in the first to fourth registers REG1 to REG4 is updated when accesses are made as illustrated in FIG. 6.

Referring to FIGS. 1, 4, 5, and 6, in the reference example, the memory device 100 has received the active command ACT and the fourth row address RA4 three times, received the active command ACT and a fifth row address RA5 once, received the active command ACT and the fourth row address RA4 three times, and received the active command ACT and the fifth row address RA5 once.

At a first time T1, as illustrated in FIG. 7, the fourth row address RA4 may be recorded in the fourth register REG4. An activation count of the fourth row address RA4 may be set to "1" through a counting operation. As the active command ACT and the fourth row address RA4 are further received two times, the row hammering control logic 135 may increase the activation count of the fourth row address RA4 to "3".

At a second time T2, all the first to fourth registers REG1 to REG4 may be in a state of recording row addresses, respectively. As described above, the activation count of the fourth row address RA4 may be "3". In this case, as illustrated in FIG. 8, because the activation count of the fourth row address RA4 is the smallest, the row hammering control logic 135 has removed the fourth row address RA4 from the fourth register REG4 and recorded the fifth row address RA5 in the fourth register REG4, with an activation count of the fifth row address RA5 being set to "1" through a counting operation.

At a third time T3, as the active command ACT and the fourth row address RA4 are received, the row hammering control logic 135 may remove the fifth row address RA5 having the smallest activation count from the fourth register REG4. The row hammering control logic 135 may record the fourth row address RA4 in the fourth register REG4. As the active command ACT and the fourth row address RA4 are further received two times, the row hammering control logic 135 may increase the activation count of the fourth row address RA4 to "3".

At a fourth time T4, as the active command ACT and the fifth row address RA5 are received, the row hammering control logic 135 may remove the fourth row address RA4 having the smallest activation count from the fourth register REG4. The row hammering control logic 135 may record the fifth row address RA5 in the fourth register REG4. An activation count of the fifth row address RA5 may be set to "1" through a counting operation.

As described above in connection with FIGS. 4 to 8, a reference example of operating the row hammering control logic 135 performs the row hammering compensation operation based on an activation count. In the reference example, even though the activation of the fourth row address RA4 is made six times, the activation count of the fourth row address RA4 may not be managed. Thus, in the case where the row hammering control logic 135 performs the row hammering compensation operation only based on an activation count, there may be an access pattern capable of avoiding the row hammering compensation operation.

In contrast to the reference example described above in connection with FIGS. 4 to 8, an example embodiment that uses a lifetime count will now be described.

Figure 9:
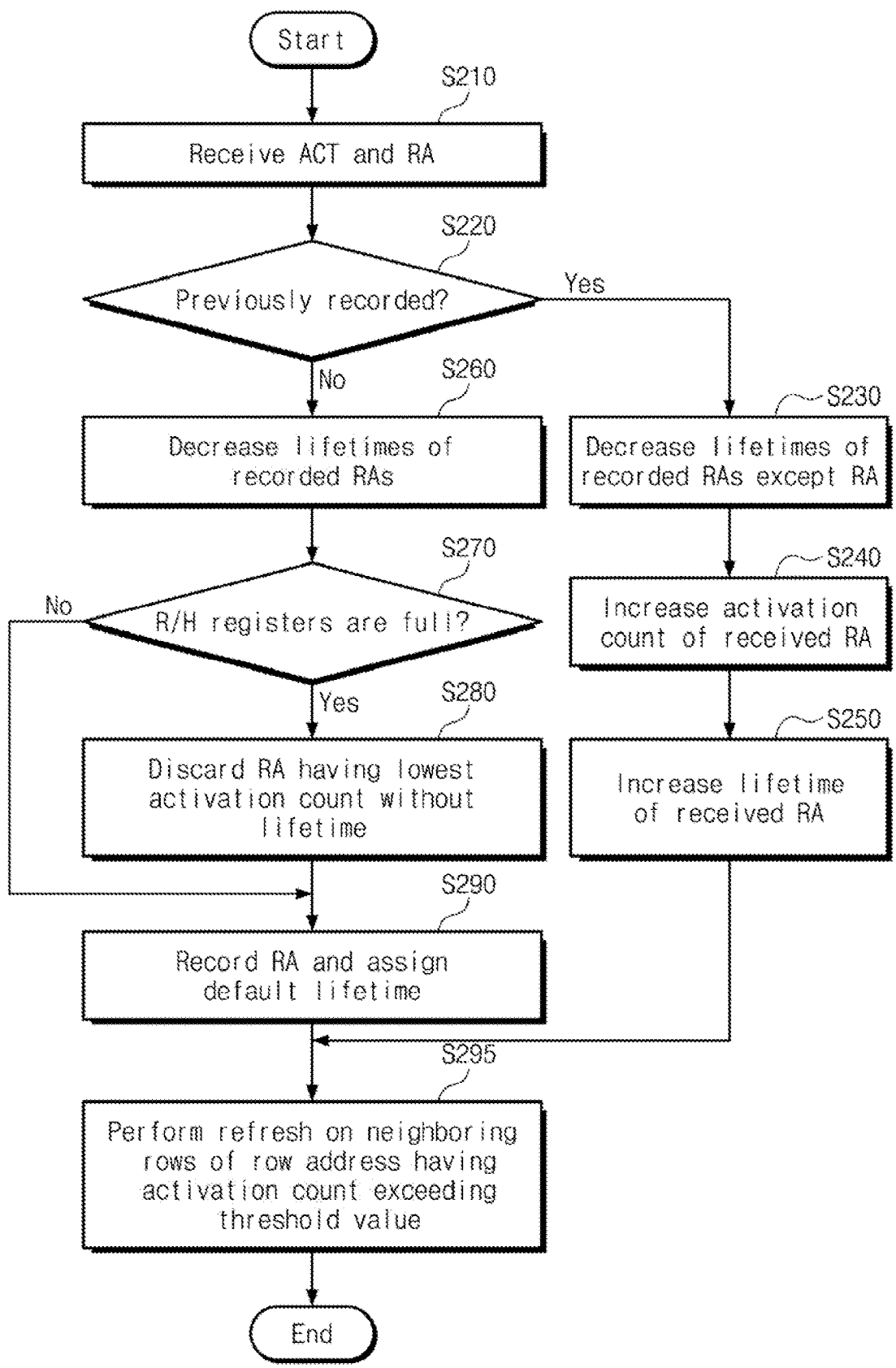
FIG. 9 illustrates an example embodiment of a method in which row hammering control logic of a memory device prevents the loss of data due to row hammering.

FIG. 9 illustrates an example embodiment of a method (e.g., a row hammering compensation operation) in which the row hammering control logic 135 of a memory device prevents the loss of data due to the row hammering using a lifetime count. FIG. 10 illustrates an example of row addresses, activation counts, and lifetime counts recorded in row hammering registers, according to the example embodiment of FIG. 9.

Referring to FIGS. 1, 9, and 10, the memory device 100 may assign (or allocate) both an activation count and a lifetime count to each of row addresses recorded in the row hammering registers.

In operation S210, the memory device 100 may receive the active command ACT and the row address RA from the external device. In operation S220, the row hammering control logic 135 may determine whether the received row address RA is a row address already recorded in the row hammering registers. When it is determined that the received row address RA is a row address already recorded in the row hammering registers, the row hammering control logic 135 may perform operation S230 to operation S250. When it is determined that the received row address RA is not a row address already recorded in the row hammering registers, the row hammering control logic 135 may perform operation S260 to operation S290.

When the received row address RA is a row address already recorded in the row hammering registers, in operation S230, the row hammering control logic 135 may decrease (e.g., count down) lifetime counts of the remaining row addresses other than the received row address RA from among the row addresses recorded in the row hammering registers. In operation S240, the row hammering control logic 135 may increase (e.g., count up) an activation count of the received row address RA. In operation S250, the row hammering control logic 135 may increase (e.g., count up) a lifetime count of the received row address RA. For example, the row hammering control logic 135 may increase the lifetime count of the received row address RA as much as a given increment count.

When the received row address RA is not a row address already recorded in the row hammering registers, in operation S260, the row hammering control logic 135 may decrease lifetime counts of the row addresses recorded in the row hammering registers. In operation S270, the row hammering control logic 135 may determine whether the row hammering registers are full. For example, the row hammering control logic 135 may determine whether row addresses are recorded in all the row hammering registers.

When it is determined that the row hammering registers are not full, the row hammering control logic 135 may perform operation S290. When it is determined that the row hammering registers are full, in operation S280, the row hammering control logic 135 may evict a row address, which does not have a lifetime count (e.g., has a lifetime count of "0") and has the lowest activation count, from among the row addresses recorded in the row hammering registers. The row hammering control logic 135 may secure a storage space of row hammering registers by evicting a row address that does not have a lifetime count and has the lowest activation count. Afterwards, the row hammering control logic 135 may perform operation S290.

In operation S290, the row hammering control logic 135 may record the received row address RA in a row hammering register and may assign (or allocate) a default lifetime count as a lifetime count of the received row address RA.

In operation S295, the row hammering control logic 135 may perform the refresh operation based on a row address that has an activation count exceeding the threshold value from among activation counts of row addresses recorded in the row hammering registers. For example, the row hammering control logic 135 may control the refresh control logic 136 such that the refresh operation is performed on rows adjacent to a row corresponding to a row address whose activation count exceeds the threshold value.

As another example, when the refresh control logic 136 performs the refresh operation based on a refresh policy, the row hammering control logic 135 may allow the refresh control logic 136 to perform the refresh operation even with respect to a row address, which has an activation count exceeding the threshold value, from among row addresses recorded in the row hammering registers.

As another example, when the refresh control logic 136 performs the refresh operation based on a refresh policy, the row hammering control logic 135 may allow the refresh control logic 136 to perform the refresh operation together with respect to "N" row addresses, which have the highest activation count (e.g., regardless of the threshold value), from among row addresses recorded in the row hammering registers. Herein, "N" may be a positive integer and may be set or adjusted depending on a policy of the row hammering control logic 135 or by the external device.

After the refresh operation is performed, the row hammering control logic 135 may reset the activation count of the row address having the activation count exceeding the threshold value or may remove the row address having the activation count exceeding the threshold value from the row hammering registers.

Referring to FIGS. 1 and 10, the row hammering registers may include the first to fourth registers REG1 to REG4. Row addresses and activation counts of FIG. 10 may be the same as the row addresses and the activation counts of FIG. 5. Accordingly, compared to the method of FIG. 4 the advantage of the lifetime count that is used in the method of FIG. 9 will be described more clearly.

In FIG. 10, in the present example, the row hammering control logic 135 has recorded the first row address RA1 in the first register REG1, and counted an activation count of "5" and a lifetime count of "1" in association with the first row address RA1 (e.g., using a counter). Also, the row hammering control logic 135 has recorded the second row address RA2 in the second register REG2, and counted an activation count of "4" and a lifetime count of "2" in association with the second row address RA2 (e.g., using a counter). Also, the row hammering control logic 135 has recorded the third row address RA3 in the third register REG3, and counted an activation count of "6" and a lifetime count of "0" in association with the third row address RA3 (e.g., using a counter).

Figures 12, 13:
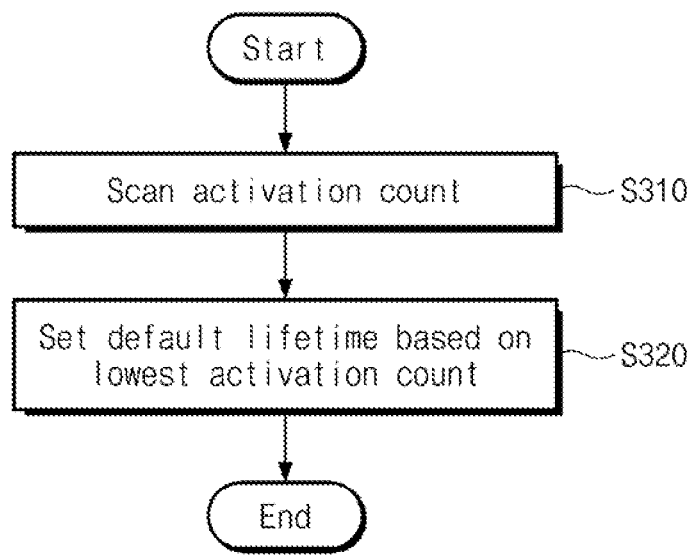

FIGS. 11 and 12 illustrate examples in which information recorded in the first to fourth registers REG1 to REG4 of FIG. 10 is updated when accesses are made as illustrated in FIG. 6.

By way of explanation for the present example embodiment, a default lifetime count, which is assigned (or allocated) when a row address is newly recorded in one of the row hammering registers, may be set to be "3".

The memory device 100 may receive the commands and addresses of FIG. 6 based on counts of the first to fourth registers REG1 to REG4 of FIG. 10.

Referring to FIGS. 1, 4, 6, 10, 11, and 12, the memory device 100 may receive the active command ACT and the fourth row address RA4 three times, may receive the active command ACT and the fifth row address RA5 once, may receive the active command ACT and the fourth row address RA4 three times, and may receive the active command ACT and the fifth row address RA5 once.

At the first time T1, as illustrated in FIG. 11, the fourth row address RA4 may be recorded in the fourth register REG4. In this case, through the counting operation, the activation count of the fourth row address RA4 may be set to "1", and the lifetime count of the fourth row address RA4 may be set to "3". The lifetime counts of the first to third row addresses RA1 to RA3 may decrease by "1" and thus may be "0", "1", and "0".

As the active command ACT and the fourth row address RA4 are further received two times, the row hammering control logic 135 may increase the activation count of the fourth row address RA4 to "3". Assuming that the increment count is "1", the lifetime count of the fourth row address RA may increase to "5". As the active command ACT and the fourth row address RA4 are further received two times, all the lifetime counts of the first to third row addresses RA1 to RA3 may decrease to "0".

At the second time T2, all the first to fourth registers REG1 to REG4 may be in a state of recording row addresses, respectively. The activation count of the fourth row address RA4 may be "3" and the lifetime count of the fourth row address RA4 may be "5". Because the fourth row address RA4 has a lifetime count, the fourth row address RA4 may be excluded from a target for eviction from the row hammering registers. The row hammering control logic 135 may select the second row address RA2, which has a lifetime count of "0" (or does not have a lifetime count) and has the lowest activation count, as a target for eviction. As illustrated in FIG. 12, the row hammering control logic 135 may remove the second row address RA2 from the second register REG2 and may record the fifth row address RA5 in the second register REG2. In this case, through the counting operation, the activation count of the fifth row address RA5 may be set to "1", and the lifetime count of the fifth row address RA5 may be set to "3".

At the third time T3, as the active command ACT and the fourth row address RA4 are received, the row hammering control logic 135 may increase the activation count of the fourth row address RA4 and may increase the lifetime count of the fourth row address RA4 as much as the increment count.

As the active command ACT and the fifth row address RA5 are received, the row hammering control logic 135 may increase the activation count of the fifth row address RA5 and may increase the lifetime count of the fifth row address RA5 as much as the increment count.

As described above, according to the present example embodiment, the memory device 100 may maintain the activated row address at a row hammering register while an active command is received as much as the number of times corresponding to at least a lifetime count. Accordingly, the row hammering compensation operation may be applied to an access pattern avoiding the row hammering compensation operation, which depends on an activation count, through alternate activations of different row addresses.

In an example embodiment, the row hammering control logic 135 may set an upper limit of a lifetime count. Even though a specific row address is repeatedly activated, the row hammering control logic 135 may not count a lifetime count of the specific row address to be higher than the upper limit. For example, the row hammering control logic 135 may set the upper limit of the lifetime count based on an activation count of a row address recorded in a row hammering register. The upper limit of the lifetime count may be set to be equal to a current value of an activation count or to be greater or smaller than the current value as much as a given value (or ratio).

In connection with the following, it will be appreciated that, as a lifetime count becomes greater, the advantage of the row hammering compensation operation may increase, but the number of row addresses recorded in the row hammering registers may increase. Thus, the number of row hammering registers necessary for the row hammering compensation operation may increase. As a lifetime count becomes smaller, the number of row addresses recorded in the row hammering registers may decrease, but the advantage of the row hammering compensation operation may decrease. To optimize the row hammering compensation operation, the memory device 100 according to an example embodiment may adaptively adjust a lifetime count, e.g., a default lifetime count or an increment count.

FIG. 13 illustrates a first example of a method in which the memory device 100 adjusts a default lifetime count, an increment count, or an upper limit of a lifetime count.

Referring to FIG. 13, the row hammering control logic 135 of the control logic 130 may scan activation counts of row addresses recorded in the row hammering registers. For example, the row hammering control logic 135 may scan activation counts of row addresses recorded in the row hammering registers in response to that the active command ACT and the row address RA are received.

In operation S320, the row hammering control logic 135 may set (or adjust) the default lifetime count (or the increment count or the upper limit of the lifetime count) based on the smallest activation count. The default lifetime count, the increment count, or the upper limit of the lifetime count may be set to be equal to a value of the smallest activation count or to be greater or smaller than the value as much as a given value (or ratio).

Figure 14:
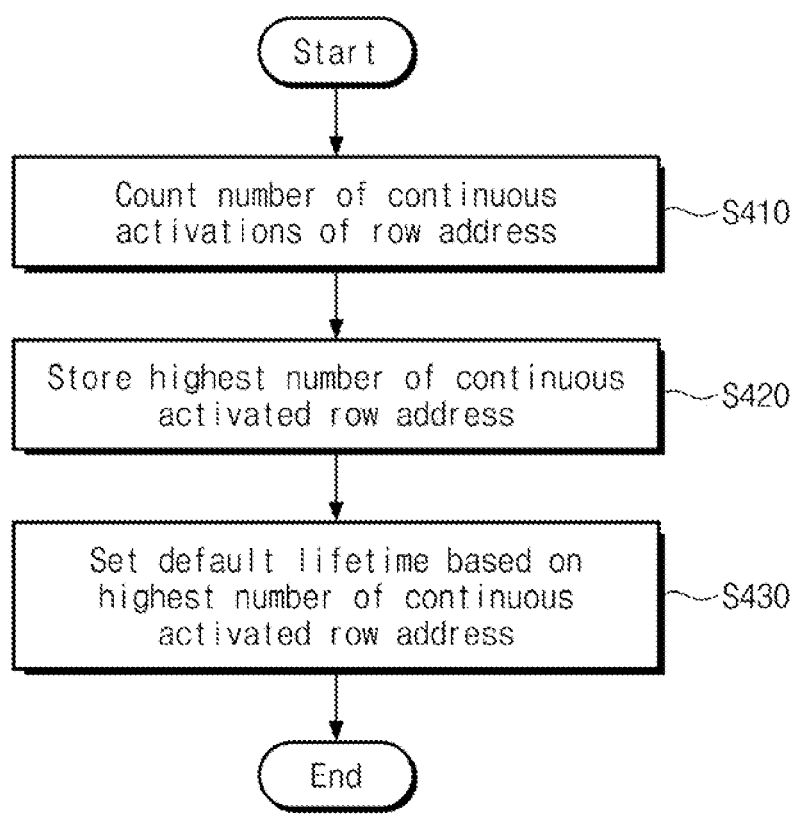
FIG. 14 illustrates a second example of a method in which a memory device adjusts a default lifetime count, an increment count, or an upper limit of a lifetime count.

FIG. 14 illustrates a second example of a method in which the memory device 100 adjusts a default lifetime count, an increment count, or an upper limit of a lifetime count.

Referring to FIG. 14, in operation S410, the row hammering control logic 135 of the control logic 130 may count (or monitor) the number of continuous activations of a row address.

In operation S420, the row hammering control logic 135 of the control logic 130 may record the highest number of continuous activations of a row address among the numbers of continuous activations of row addresses.

In operation S430, the row hammering control logic 135 may set (or adjust) the default lifetime count (or the increment count or the upper limit of the lifetime count) based on the highest number of continuous activations of a row address. The default lifetime count, the increment count, or the upper limit of the lifetime count may be set to be equal to the highest number of continuous activations of a row address or to be greater or smaller than the highest number of continuous activations of a row address as much as a given value (or ratio).

Figure 15:
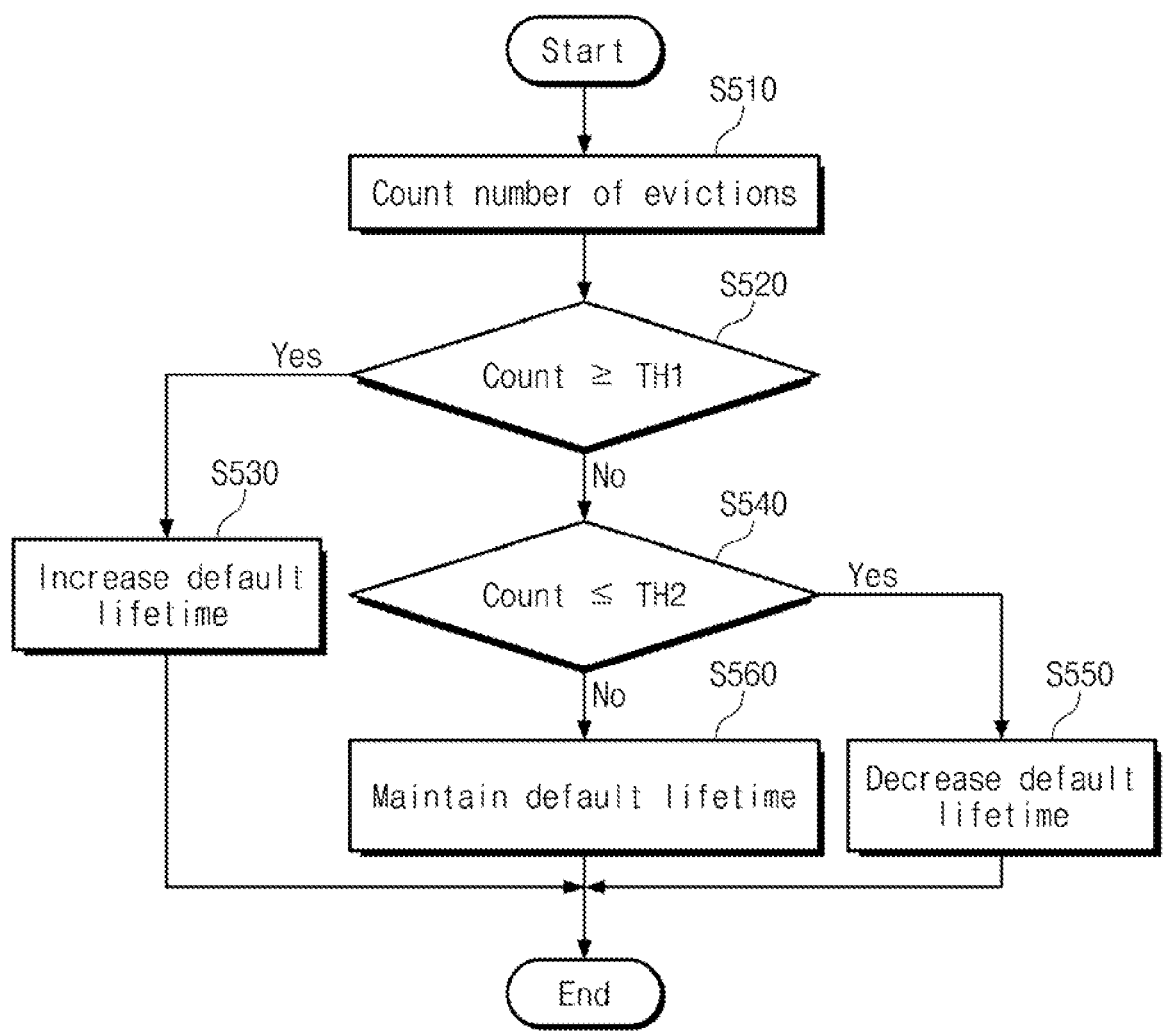
FIG. 15 illustrates a third example of a method in which a memory device adjusts a default lifetime count, an increment count, or an upper limit of a lifetime count.

FIG. 15 illustrates a third example of a method in which the memory device 100 adjusts a default lifetime count, an increment count, or an upper limit of a lifetime count. Referring to FIG. 15, in operation S510, the row hammering control logic 135 of the control logic 130 may count the number of times that a row address is evicted from the row hammering registers. For example, while there are received active commands and row addresses, the number of which is latest determined, the row hammering control logic 135 may count the number of row addresses evicted (i.e., the number of evicted row addresses or number of evictions) from the row hammering registers.

In operation S520, the row hammering control logic 135 may determine whether the number of evicted row addresses is equal to or greater than a first threshold value TH1. When the number of evicted row addresses is equal to or greater than the first threshold value TH1, an access pattern capable of causing the loss of data due to the row hammering may be suspected. Accordingly, in operation S530, the row hammering control logic 135 may increase the default lifetime count (or the increment count or the upper limit of the lifetime count).

When the number of evicted row addresses is not equal to or greater than the first threshold value TH1, i.e., is smaller than the first threshold value TH1, the row hammering control logic 135 may perform operation S540. In operation S540, the row hammering control logic 135 may determine whether the number of evicted row addresses is equal to or smaller than a second threshold value TH2. When the number of evicted row addresses is equal to or smaller than the second threshold value TH2, it may be considered that an access pattern capable of causing the loss of data due to the row hammering is absent. Accordingly, in operation S550, the row hammering control logic 135 may decrease the default lifetime count (or the increment count or the upper limit of the lifetime count). In an example embodiment, the second threshold value TH2 may be smaller than the first threshold value TH1.

When the number of evicted row addresses is not equal to or smaller than the second threshold value TH2, i.e., is greater than the second threshold value TH2, the row hammering control logic 135 may perform operation S560. In operation S560, the row hammering control logic 135 may maintain the default lifetime count (or the increment count or the upper limit of the lifetime count).

Figure 16:
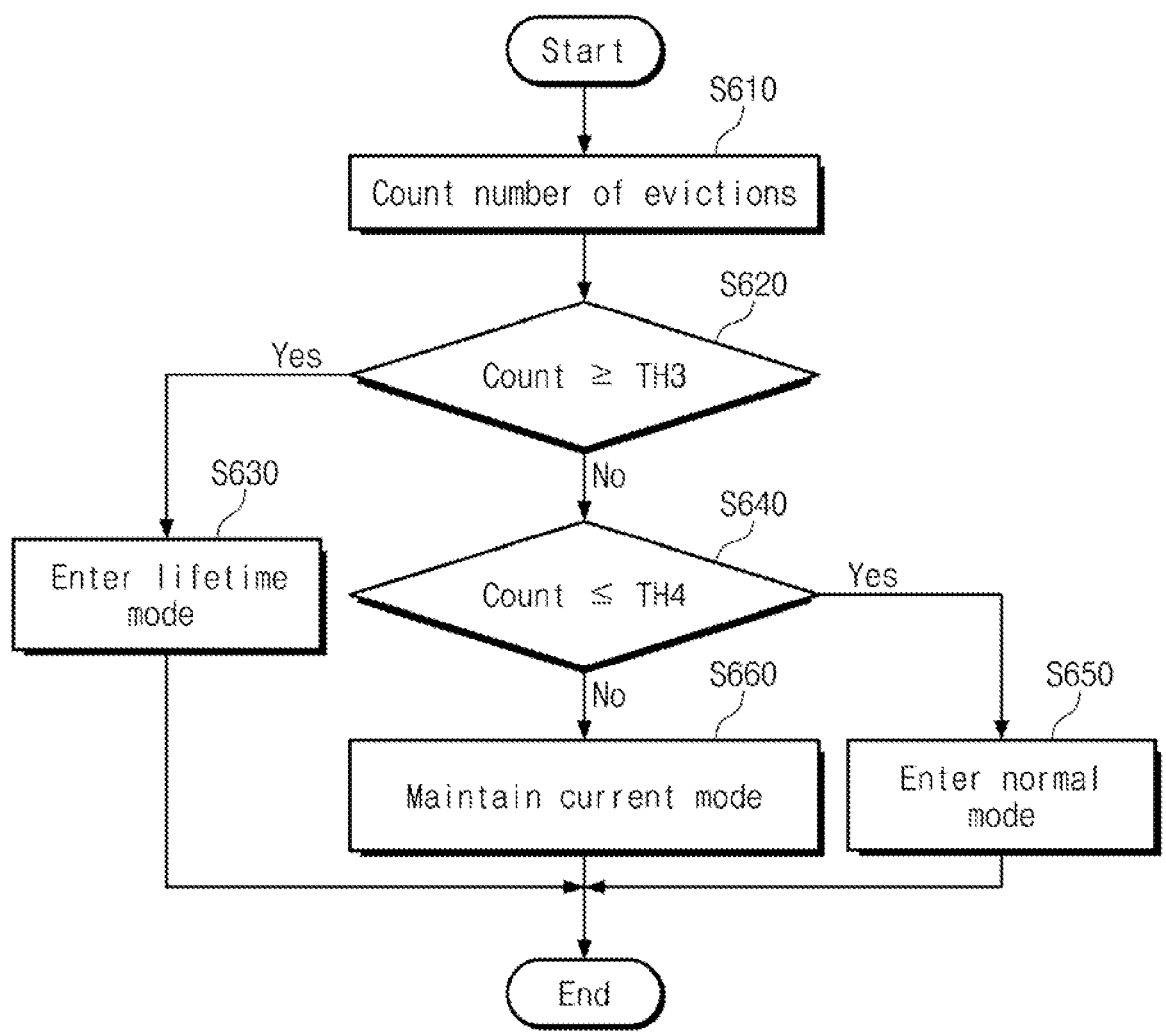
FIG. 16 illustrates a first example of a method in which a memory device selectively performs the assignment of a lifetime count.

FIG. 16 illustrates a first example of a method in which the memory device 100 selectively performs the assignment (or allocation) of a lifetime count.

Referring to FIG. 16, in operation S610, the row hammering control logic 135 of the control logic 130 may count the number of times that a row address is evicted from the row hammering registers. For example, while there are received active commands and row addresses, the number of which is latest determined, the row hammering control logic 135 may count the number of row addresses evicted from the row hammering registers.

In operation S620, the row hammering control logic 135 may determine whether the number of evicted row addresses is equal to or greater than a third threshold value TH3. When the number of evicted row addresses is equal to or greater than the third threshold value TH3, an access pattern capable of causing the loss of data due to the row hammering may be suspected. Accordingly, in operation S630, the row hammering control logic 135 may enter a lifetime count mode in which lifetime counts are assigned to row addresses. In the lifetime count mode, the memory device 100 may reinforce the row hammering compensation operation.

When the number of evicted row addresses is not equal to or greater than the third threshold value TH3, i.e., is smaller than the third threshold value TH3, the row hammering control logic 135 may perform operation S640. In operation S640, the row hammering control logic 135 may determine whether the number of evicted row addresses is equal to or smaller than a fourth threshold value TH4. When the number of evicted row addresses is equal to or smaller than the fourth threshold value TH4, it may be considered that an access pattern capable of causing the loss of data due to the row hammering is absent. Accordingly, in operation S650, the row hammering control logic 135 may enter a normal mode in which lifetime counts are not assigned to row addresses. In the normal mode, the memory device 100 may decrease resources necessary for the row hammering compensation operation.

When the number of evicted row addresses is not equal to or smaller than the fourth threshold value TH4, i.e., is greater than the fourth threshold value TH4, the row hammering control logic 135 may perform operation S660. In operation S660, the row hammering control logic 135 may maintain a current mode.

Figure 17:
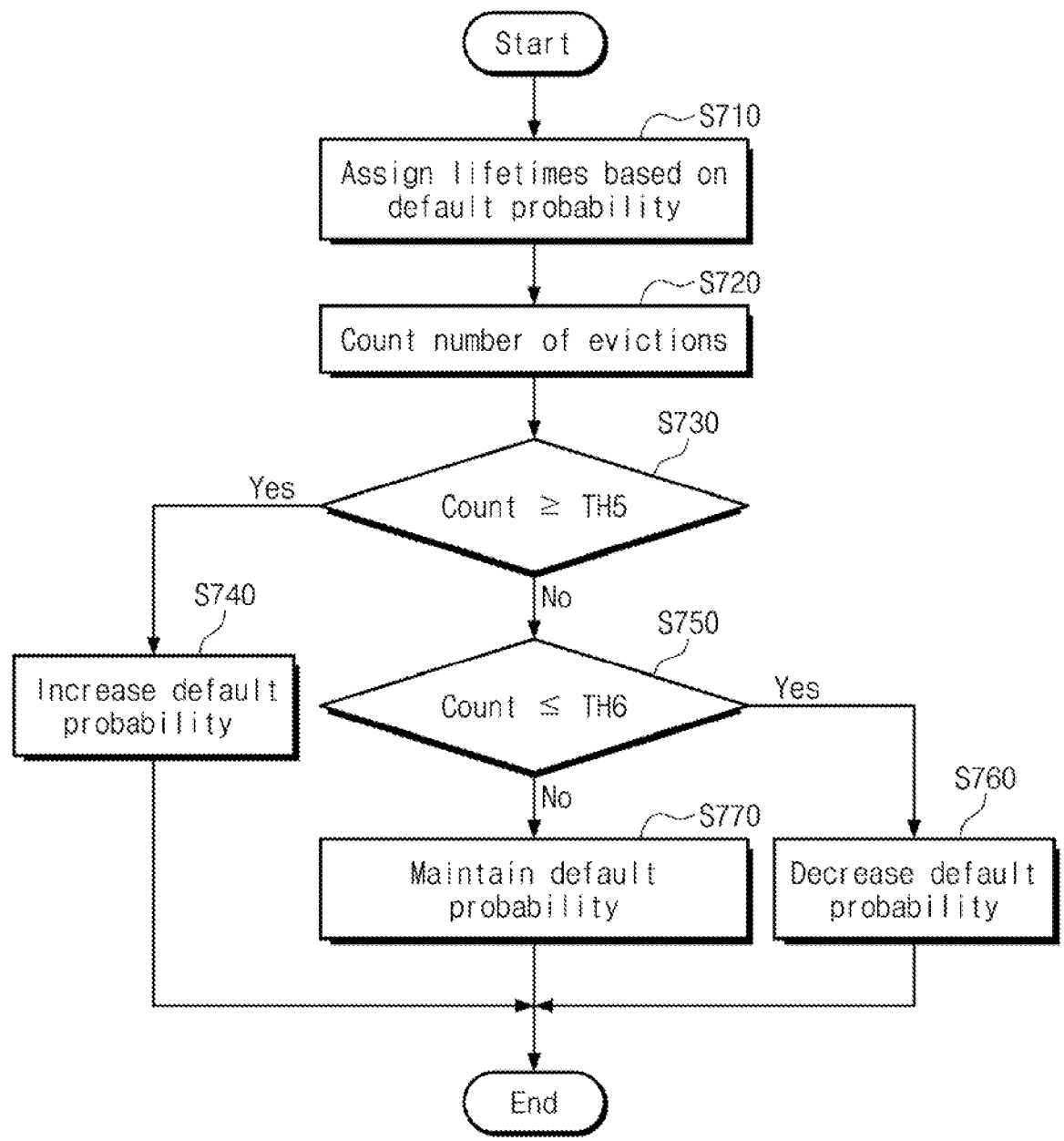
FIG. 17 illustrates a second example of a method in which a memory device selectively performs the assignment of a lifetime count.

FIG. 17 illustrates a second example of a method in which the memory device 100 selectively performs the assignment (or allocation) of a lifetime count.

Referring to FIG. 17, in operation S710, the row hammering control logic 135 may assign lifetime counts to row addresses based on a probability. For example, based on a default probability, the row hammering control logic 135 may assign a lifetime count to a row address or may not assign a lifetime count to a row address.

For example, when a row address is received from the external device, the row hammering control logic 135 may generate a random number. The default probability may indicate a portion of a range of values that a random number is able to have. When a value of the generated random number belongs to the range of the default probability, the row hammering control logic 135 may assign a lifetime count to the received row address. When the value of the generated random number does not belong to the range of the default probability, the row hammering control logic 135 may not assign a lifetime count to the received row address. However, the embodiment in which the row hammering control logic 135 assigns a lifetime count to a row address based on probability may be varied.

In operation S720, the row hammering control logic 135 of the control logic 130 may count the number of times that a row address is evicted from the row hammering registers. For example, while there are received active commands and row addresses, the number of which is latest determined, the row hammering control logic 135 may count the number of row addresses evicted from the row hammering registers.

In operation S730, the row hammering control logic 135 may determine whether the number of evicted row addresses is equal to or greater than a fifth threshold value TH5. When the number of evicted row addresses is equal to or greater than the fifth threshold value TH5, an access pattern capable of causing the loss of data due to the row hammering may be suspected. Accordingly, in operation S740, the row hammering control logic 135 may increase the default probability of assigning lifetime counts to row addresses. For example, the row hammering control logic 135 may expand the range of the default probability. Thus, the memory device 100 may reinforce the row hammering compensation operation.

When the number of evicted row addresses is not equal to or greater than the fifth threshold value TH5, i.e., is smaller than the fifth threshold value TH5, the row hammering control logic 135 may perform operation S750. In operation S750, the row hammering control logic 135 may determine whether the number of evicted row addresses is equal to or smaller than a sixth threshold value TH6. When the number of evicted row addresses is equal to or smaller than the sixth threshold value TH6, it may be considered that an access pattern capable of causing the loss of data due to the row hammering is absent. Accordingly, in operation S760, the row hammering control logic 135 may decrease the default probability of assigning lifetime counts to row addresses. For example, the row hammering control logic 135 may reduce the range of the default probability. Thus, the memory device 100 may decrease resources necessary for the row hammering compensation operation.

When the number of evicted row addresses is not equal to or smaller than the sixth threshold value TH6, i.e., is greater than the sixth threshold value TH6, the row hammering control logic 135 may perform operation S770. In operation S770, the row hammering control logic 135 may maintain a current default probability.

Figure 18:
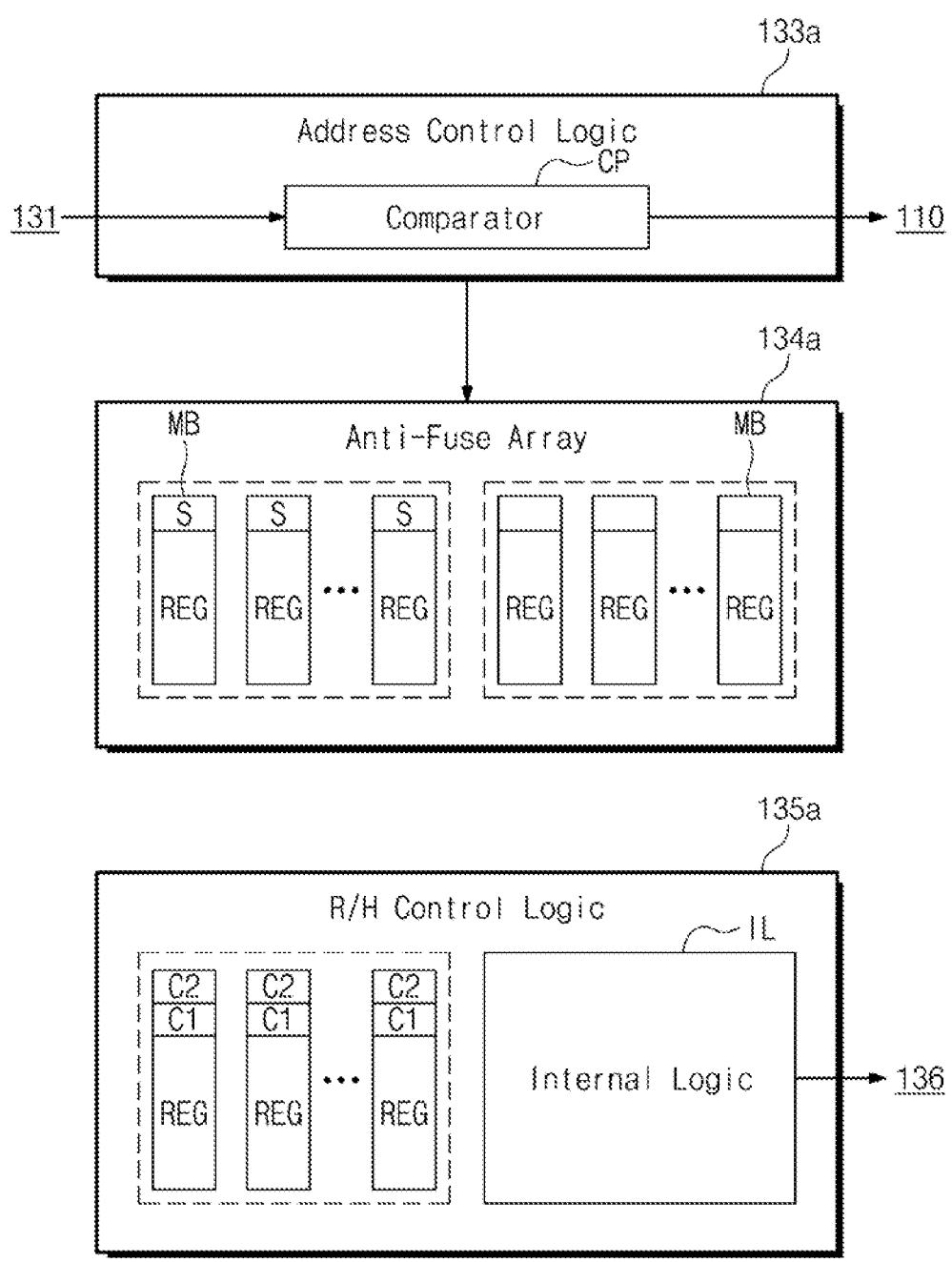
FIG. 18 illustrates a first example to implement address control logic, an anti-fuse array, and row hammering control logic.

FIG. 18 illustrates a first example to implement address control logic 133a, an anti-fuse array 134a, and row hammering control logic 135a.

Referring to FIGS. 1 and 18, the address control logic 133a may include a comparator CP. The anti-fuse array 134a may include a plurality of registers REG and master bits MB corresponding to the plurality of registers REG.

Each of the registers REG of the anti-fuse array 134a may be configured to store an address of a defective row. When an address of a defective row is stored in the register REG, the master bit MB corresponding to the register REG may be set ("S"). When an address of a defective row is absent from the register REG, the master bit MB corresponding to the register REG may not be set.

When a row address (e.g., including a bank group address and a bank address) transferred from the decoder 131 is absent from the anti-fuse array 134a, the address control logic 133a may provide the row address transferred from the decoder 131 to the memory core 110. When the row address (e.g., including a bank group address and a bank address) transferred from the decoder 131 is present in the anti-fuse array 134a, the address control logic 133a may provide a spare row address corresponding to the row address transferred from the decoder 131 to the memory core 110.

The row hammering control logic 135a may include internal logic IL, a plurality of registers REG, and counter sets respectively corresponding to the registers REG of the row hammering control logic 135a. Herein, each of the counter sets may include a first counter C1 and a second counter C2. The registers REG of the row hammering control logic 135a may be used as the row hammering registers. The registers REG of the row hammering control logic 135a may be configured to record activated row addresses.

The first counters C1 may count activation counts of row addresses recorded in the registers REG of the row hammering control logic 135a. The second counters C2 may count lifetime counts of the row addresses recorded in the registers REG of the row hammering control logic 135a. The internal logic IL of the row hammering control logic 135a may determine whether to evict row addresses based on the lifetime counts of the second counters C2 and the activation counts of the first counters C1. The internal logic IL of the row hammering control logic 135a may control the refresh operation of the refresh control logic 136 based on the activation counts of the first counters C1.

Figure 19:
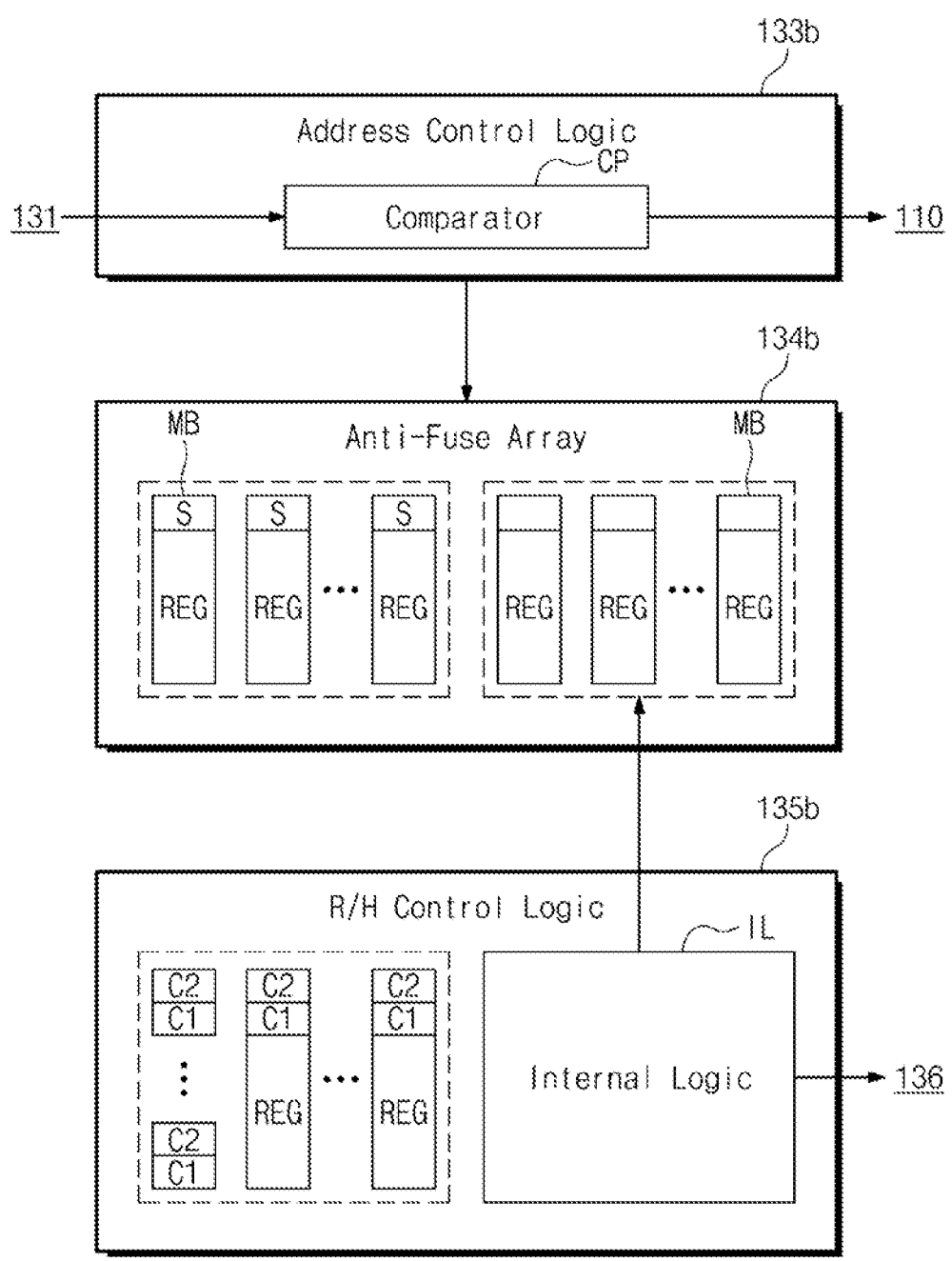
FIG. 19 illustrates a second example to implement address control logic, an anti-fuse array, and row hammering control logic.

FIG. 19 illustrates a second example to implement address control logic 133b, an anti-fuse array 134b, and row hammering control logic 135b.

Referring to FIGS. 1 and 19, configurations and operations of the address control logic 133b and the anti-fuse array 134b may be the same as the configurations and operations of the address control logic 133a and the anti-fuse array 134a of FIG. 18. Thus, additional description will be omitted to avoid redundancy.

The row hammering control logic 135b may include a plurality of registers REG, first counters C1, and second counters C2. In the row hammering control logic 135b, some of the first counters C1 and some of the second counters C2 may not have corresponding registers.

The internal logic IL of the row hammering control logic 135b may record some of activated row addresses in registers, in which defective row addresses are not recorded, from among the registers REG of the anti-fuse array 134b. The internal logic IL of the row hammering control logic 135b may count activation counts and lifetime counts of activated row addresses recorded in the registers REG of the anti-fuse array 134b, using the first counters C1 and the second counters C2 that do not have corresponding registers within the row hammering control logic 135b.

Thus, the row hammering registers that record activated row addresses may include registers of the row hammering control logic 135b and registers of the anti-fuse array 134b. As some of activated row addresses are recorded in the registers of the anti-fuse array 134b, the overhead of the second counters C2 being added to count a lifetime count may be compensated for.

In describing the above, components may be referred to using the terms "first," "second," "third," etc. However, the terms "first," "second," "third," etc., may be used to distinguish components from each other, but the terms "first," "second," "third," etc., may not involve an order or a numerical meaning of any form. Also, components may be referenced using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

As described above, embodiments relate to a memory device configured to help prevent loss of data due to row hammering, and an operating method of a memory device.

According to an example embodiment, a memory device may manage an activation count and a lifetime count of a row address. Using the lifetime count, various patterns of row hammering may be provided for, to prevent data loss.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a memory core including a plurality of capacitor-based memory cells; and
control logic, the control logic including registers and counters, wherein the control logic is configured to:
receive a first active command and a first row address from an external device;
activate memory cells corresponding to the first row address, from among the plurality of memory cells, in response to the first active command;
record the first row address in a first register of the registers;
count an activation count of the first row address using a first counter of the counters; and
count a lifetime count of the first row address using a second counter of the counters.

2. The memory device as claimed in claim 1, wherein the control logic is configured to, in response to a second active command and a second row address being received from the external device,
record the second row address in a second register of the registers;
count an activation count of the second row address using a third counter of the counters; and
count a lifetime count of the second row address using a fourth counter of the counters.

3. The memory device as claimed in claim 2, wherein the control logic is configured to decrease the lifetime count of the first row address in response to the second active command and the second row address being received from the external device.

4. The memory device as claimed in claim 2, wherein the control logic is configured to, when row addresses are present in all the registers,
evict a row address, which has a lifetime of "0" and has the smallest activation count, from among the row addresses present in the registers; and
record the second row address in a register of the evicted row address.

5. The memory device as claimed in claim 1, wherein the control logic is configured to, in response to a third active command and the first row address being received from the external device,
increase the activation count of the first row address; and
increase the lifetime count of the first row address.

6. The memory device as claimed in claim 5, wherein the control logic is configured to increase the lifetime count of the first row address as much as an increment count.

7. The memory device as claimed in claim 6, wherein the control logic is configured to adjust the increment count based on at least one of:
activation counts of row addresses recorded in the registers;
a number of times that a same row address is continuously activated; or
a number of row addresses evicted from the registers.

8. The memory device as claimed in claim 1, wherein the control logic is configured to increase the lifetime count of the first row address as much as a default lifetime count.

9. The memory device as claimed in claim 8, wherein the control logic is configured to adjust the default lifetime count based on at least one of:
activation counts of row addresses recorded in the registers;
a number of times that a same row address is continuously activated; or
a number of row addresses evicted from the registers.

10. The memory device as claimed in claim 8, wherein the control logic is configured to adjust the default lifetime count based on an activation count being a smallest count from among the activation counts of row addresses recorded in the registers.

11. The memory device as claimed in claim 8, wherein the control logic is configured to count the number of times that a same row address is continuously activated for each of row addresses, store a greatest value of the counted numbers of times, and adjust the default lifetime count based on the greatest value.

12. The memory device as claimed in claim 8, wherein, when the number of row addresses evicted from the registers is equal to or greater than a first threshold value, the control logic adjusts the default lifetime count by increasing the default lifetime count, and wherein, when the number of row addresses evicted from the registers is equal to or smaller than a second threshold value, the control logic adjusts the default lifetime count by decreasing the default lifetime count.

13. A memory device, comprising:
a memory core including a plurality of capacitor-based memory cells; and
control logic, the control logic including registers and counters, wherein the control logic is operable in a first mode and a second mode, and is configured to:
receive a first active command and a first row address from an external device;
activate memory cells corresponding to the first row address, from among the plurality of memory cells, in response to the first active command;
in the first mode:
record the first row address in one of the registers, count an activation count of the first row address using a first counter of the counters, and count a lifetime count of the first row address using a second counter of the counters; and
in the second mode:
record the first row address in one of the registers, and
count the activation count of the first row address using the first counter of the counters.

14. The memory device as claimed in claim 13, wherein, when the number of row addresses evicted from the registers is equal to or greater than a first threshold value, the control logic enters the first mode, and
wherein, when the number of row addresses evicted from the registers is equal to or smaller than a second threshold value, the control logic enters the second mode.

15. The memory device as claimed in claim 13, wherein the control logic selects one of the first mode and the second mode based on a probability.

16. The memory device as claimed in claim 15, wherein, when the number of row addresses evicted from the registers is equal to or greater than a first threshold value, the control logic increases a probability of entering the first mode, and
wherein, when the number of row addresses evicted from the registers is equal to or smaller than a second threshold value, the control logic decreases the probability of entering the first mode.

17. The memory device as claimed in claim 15, wherein:
the control logic includes an anti-fuse array including a plurality of registers configured to record defective row addresses, and the control logic is configured to record some of activated row addresses in registers, in which defective row addresses are not recorded, from among the plurality of registers included in the anti-fuse array.

18. An operating method of a memory device that includes memory cells and registers configured to record row addresses, the method comprising:
receiving, at the memory device, an active command and a first row address from an external device;
when row addresses are recorded in all the registers, evicting a second row address, which has a lifetime count of "0" and has a smallest activation count, from among row addresses recorded in the registers; and
storing, at the memory device, the first row address in an empty register of the registers, increasing an activation count of the first row address, and increasing a lifetime count of the first row address.

19. The method as claimed in claim 18, further comprising:
decreasing, at the memory device, lifetime counts of row addresses recorded in the registers in response to the memory device receiving the active command and the first row address from the external device.

20. The method as claimed in claim 18, further comprising:
adaptively adjusting, at the memory device, a default lifetime count that is allocated to a third row address to be newly recorded in the registers.

* * * * *